(12) United States Patent
Chang

(10) Patent No.: US 7,535,306 B2
(45) Date of Patent: May 19, 2009

(54) OSCILLATOR COUPLING SYSTEM

(76) Inventor: Heng-Chia Chang, 2Fl., No. 13-3 Lane 53, ShuangLian St, Taipei (TW)

( * ) Notice: Subject to any disclaimer, the term of this patent is extended or adjusted under 35 U.S.C. 154(b) by 111 days.

(21) Appl. No.: 11/614,465

(22) Filed: Dec. 21, 2006

(65) Prior Publication Data
US 2007/0205838 A1 Sep. 6, 2007

(30) Foreign Application Priority Data
Feb. 27, 2006 (TW) .............................. 95106552 A

(51) Int. Cl.
*H03B 9/14* (2006.01)
(52) U.S. Cl. .............................. 331/56; 331/46; 331/55
(58) Field of Classification Search .................. 331/50, 331/55, 56, 46, 74, 172
See application file for complete search history.

(56) References Cited
U.S. PATENT DOCUMENTS 5,138,284 A * 8/1992 Yabuki et al. .................. 331/56
6,188,292 B1 * 2/2001 Liu .............................. 331/45
6,870,432 B2 * 3/2005 Li et al. ......................... 331/46
7,078,979 B2 * 7/2006 Dally et al. .................... 331/57

* cited by examiner

*Primary Examiner*—Robert Pascal
*Assistant Examiner*—Ryan J. Johnson
(74) *Attorney, Agent, or Firm*—Shoemaker and Mattare

(57) ABSTRACT

An oscillator coupling system includes a plurality of oscillating members and a plurality of delay members connecting at least two of the oscillating members. Between the delay members is a specific phase or time delay relationship such that characteristics of phase or frequency noise suppression correlation of the two oscillating members are coupled to each other by the delay members, thereby reducing noise autocorrelation while the oscillator coupling system is in operation, enhancing phase or frequency noise suppression, using no bulky elements such as solid state circulators, isolators and resonators, reducing signal distortion, and increasing system stability.

15 Claims, 7 Drawing Sheets

OSCILLATOR COUPLING SYSTEM

BACKGROUND OF THE INVENTION

1. Field of the Invention

The present invention relates to a noise reduction technology, and more particularly, to an oscillator coupling system applied in high and low frequency environment for phase or frequency noise suppression.

2. Description of Related Art

In communication circuits and electronic systems, noise can be generated by signal sources or oscillation generating components due to interference coming from such as thunderstroke, switches of peripheral load devices, an electric generator, wireless communication, poor contact between conductive lines or switches, bad grounding, radio interference and so on. Noise adversely affects system efficiency. For example, noise results in random errors during access to data files or executing executable files on a storage device. Noise can also lead to abnormal operations of computers and program controllers, or disturb communication systems.

In order to reduce noise, developers put forth phase or frequency noise reduction methods, such as a low frequency oscillating noise suppression method for use in semi-conductor devices, a special oscillator circuit design method, a high quality factor resonator design method, and a method of using injection signals for phase lock. The method of injecting signals for phase lock is further divided into three categories, namely high frequency signal injection, low frequency signal injection, and mixed signal injection (injection of a mixture of high-frequency oscillator signals and low-frequency oscillator signals). But, with the advances in science and technology, high frequency systems are becoming much more popular in electronic and communication field.

FIG. 1a is a block diagram of a conventional oscillator coupling system. As shown in FIG. 1a, a delay member 21' connects, in series, a first oscillating member 11' and a second oscillating member 13'. The delay member 21' sends signal frequency and noise generated by the first oscillating member 11' to the output port of the second oscillating member 13'. The delay member 21' sends signal frequency and noise generated by the second oscillating member 13' to the output port of the first oscillating member 11'. Thus, signals outputted by different oscillator coupling systems can end up with an identical operating frequency, and phase of the signals can be locked. Further, a certain degree of phase or frequency noise suppression correlation between different circuit systems can be obtained by means of the noise from the oscillator coupling system. Thereafter, oscillating signals with reduced phase or frequency noise is provided for circuit loads, and thus providing a stable work environment. Accordingly, the conventional oscillator coupling system is applied in high power combining systems and active phased arrays.

FIG. 1b is a block diagram of another conventional oscillator coupling system. The oscillator coupling system of FIG. 1b mainly differs from that of FIG. 1a in that the oscillator coupling system shown in FIG. 1b further comprises a phase shifting member 15' disposed at the output port of the second oscillating member 13'. Oscillating signals and noise from the second oscillating member 13' are first shifted a default angle by the phase shifting member 15' before being transmitted through the delay member 21' for noise suppression. As regards the oscillator coupling system, signals of a certain mode of frequency can be suppressed while signals of another mode of frequency can be enhanced. Thus, combination of power of oscillator signals of a specific frequency can be enhanced. The whole coupling circuit is called a push-push oscillator. Compared with any single oscillator, the coupling circuit has a 6 dB signal power improvement.

FIG. 1c is a block diagram showing another conventional oscillator coupling system. As shown in FIG. 1c, a delay member 21' composed of two unidirectional amplifiers oppositely disposed between two oscillating members so as to correlate noise suppression of one oscillating member with that of the other. Examples are conventional cross-coupled oscillators and quadrature-coupled oscillators. It should be noted that the delay member 21' should not affect the oscillation of the oscillator members.

In the above known oscillator coupling system, a coupling circuit connects two oscillators, and the coupling circuit transmits oscillating signals of the oscillators. If a circuit connecting two oscillators merely provides time-independent constant DC voltage or DC current or is grounded, the circuit will not be regarded as a coupling circuit. Oscillating signals of two different oscillators do not correlate to each other in the absence of the coupling circuit. A certain degree of noise suppression is possible, not only because both the two oscillators produce noise, but also because the coupling circuit allows amplitude offset to occur to different noise of the two oscillators. As a result, at a frequency for stable output signal, a 3 dB (or 10 log2) maximum reduction of phase noise can be achieved. By contrast, given an in-phase coupling system with a number N of oscillators (where N is a positive integer), the maximum reduction of phase noise is a mere 10 logN dB.

However, with the advances in science and technology, the operating frequencies of satellite communication, satellite network, satellite positioning, and wireless network have increased to between dozens of MHz and dozens of GHz. It has become much more difficult to reduce noise much more efficiently only through the abovementioned oscillator coupling system. As a result, signal to noise ratio of the whole communication system is likely to be compromised, and the minimum detectable signal power of the system can be affected, thereby limiting the effective signal transmitting and receiving distance, and even resulting in insufficient bandwidth.

Accordingly, there is an urgent need to develop a coupling system which will efficiently overcome the above drawbacks of the prior art, fulfill the high frequency circuit requirements, and enhance phase or frequency noise suppression effect so as to increase system operation bandwidth and enhance operation efficiency.

SUMMARY OF THE INVENTION

In light of the above drawbacks of the prior art, an objective of the present invention is to provide an oscillator coupling system for making noise suppression simpler, using simple circuit components.

Another objective of the present invention is to provide an oscillator coupling system for enhancing phase or frequency noise suppression, thereby reducing signal distortion and increasing system stability.

A further objective of the present invention is to provide an oscillator coupling system applicable in a high frequency environment for increasing bandwidth, decreasing phase or frequency noise interference, changing input/output impedance and saving power consumption.

To achieve the above and other objectives, the present invention proposes an oscillator coupling system, which comprises a plurality of oscillating members, at least a first delay member, and at least a second delay member. The first delay member connects at least two of the oscillating members such that the two oscillating members inject oscillating signals into each other and thereby achieve phase locking. The second delay member connects the two oscillating members and introduces a phase or time delay parameter at least several times larger than that of the first delay member so as to couple the two oscillating members characterized by correlated phase or frequency noise suppression and reduce noise autocorrelation of the oscillator coupling system, thereby enhancing noise suppression of the oscillator coupling system while the system is in operation.

The first delay member can be a signal line or an amplifier. The signal line is one of a cable line, a conductive line and an electric transmission line. The amplifier is at least one of a unidirectional amplifier and a bidirectional amplifier. The second delay member is one of a phase delay member and a time delay member, which can be an adjustable RLC circuit element, a delay signal line, a delay IC or an amplifier.

Furthermore, the second delay member can be in series connection with a resistor for adjusting the quality factor of the second delay member and strength of the injection signal. The second delay member is used to reduce noise autocorrelation between the oscillating members so as to obtain an optimal coupling phase or frequency noise reduction correlation between the oscillating members. Thereby, the oscillator coupling system can be adjusted or optimally designed according to different circuit characteristic of different products.

By disposing at least a first delay member and at least a second delay member between the at least two oscillating members, the two oscillating members are coupled and a better phase or frequency noise reduction effect can be achieved, thereby reducing signal distortion and increasing system stability. In addition, elements such as solid state circulators, isolators and resonators that occupy spaces can be avoided to be used.

DETAILED DESCRIPTION OF PREFERRED EMBODIMENTS

Hereunder, embodiments of the present invention will be described in full detail with reference to the accompanying drawings.

Figure 1A:
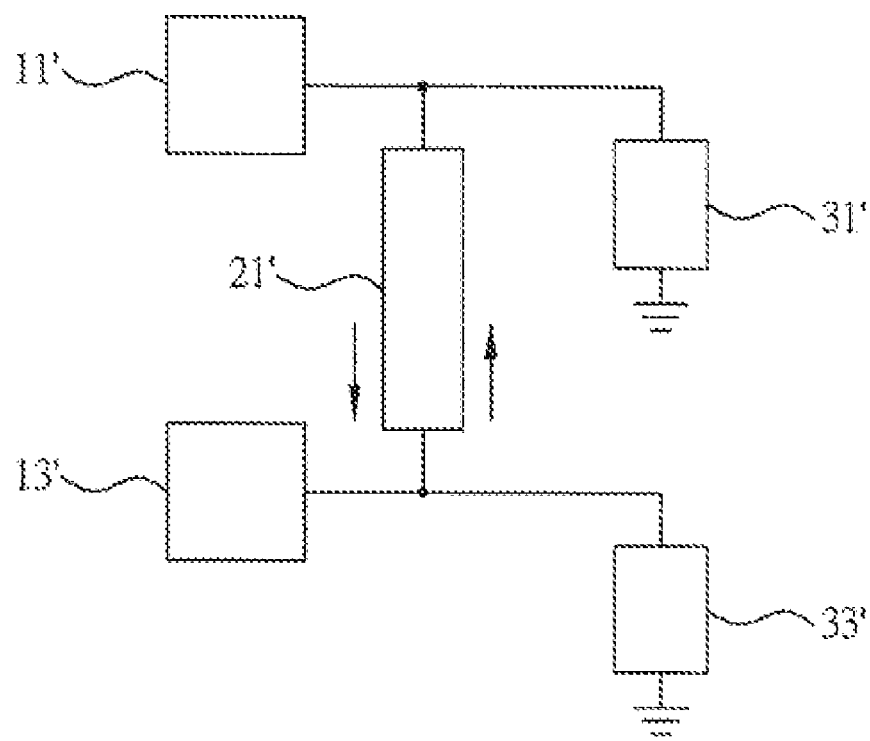
FIG. 1a is a block diagram of a conventional oscillator coupling system.
Figure 1B:
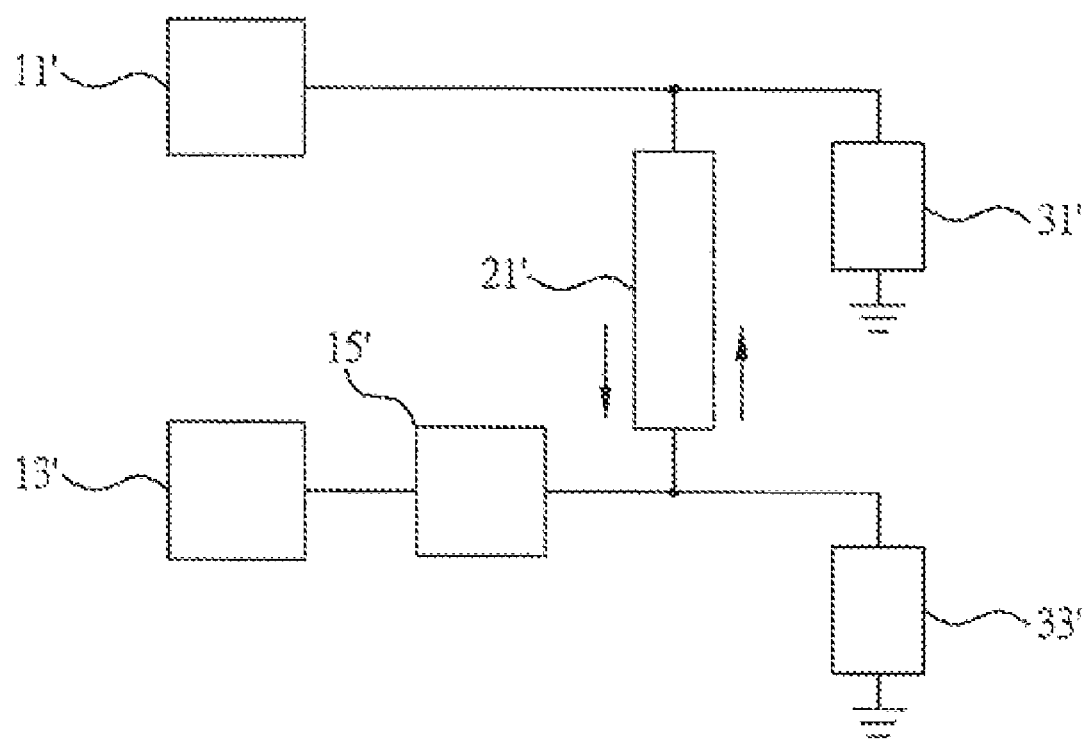
FIG. 1b is a block diagram of an oscillator coupling system applicable in a high frequency environment of the prior art.
Figure 1C:
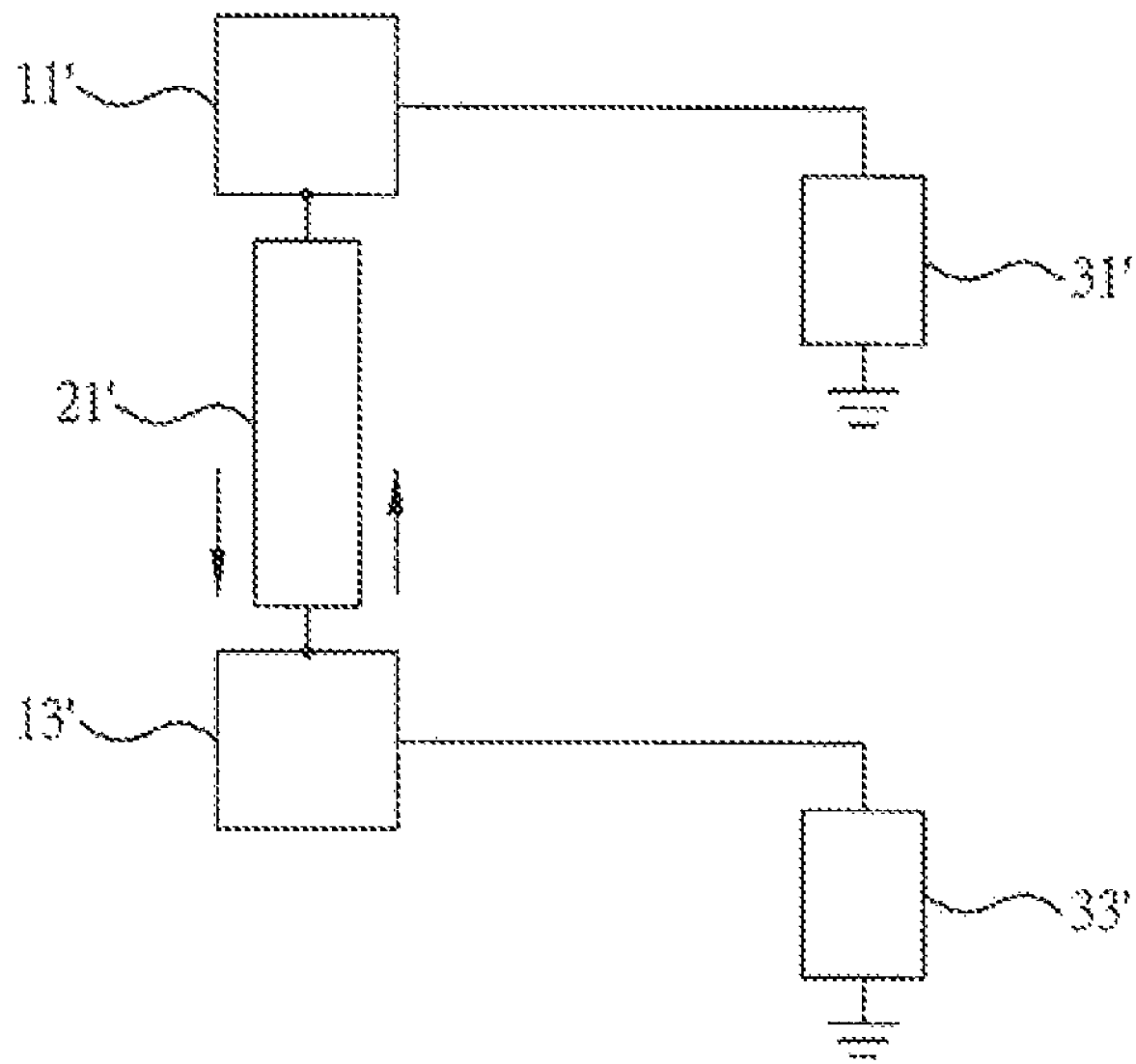
FIG. 1c is a block diagram of an oscillator coupling system with a delay member disposed between the non-output ports of the oscillating members of the prior art.
Figure 2:
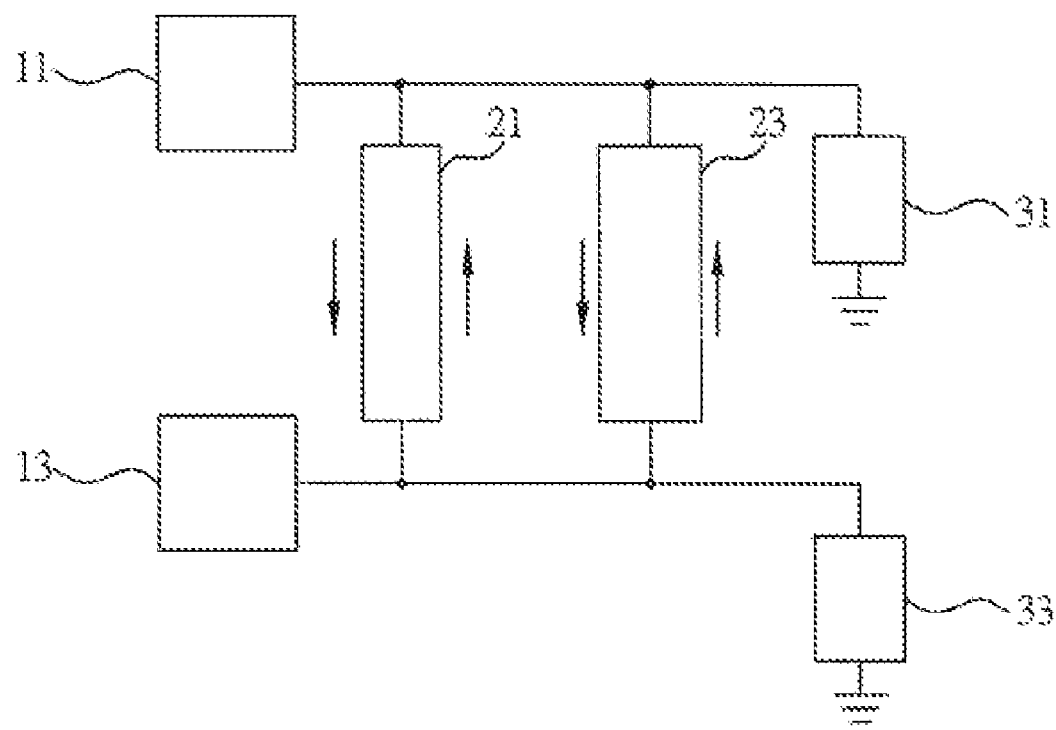
FIG. 2 is a block diagram of an oscillator coupling system according to a first embodiment of the present invention.

FIG. 2 is a block diagram of an oscillator coupling system according to a first embodiment of the present invention. As shown in FIG. 2, the oscillator coupling system of the present invention comprises two oscillating members 11 and 13; a first delay member 21 connected between the oscillating members 11 and 13; and a second delay member 23 connected between the oscillating members 11 and 13 and in parallel with the first delay member 21. Therein, the second delay member 23 has a phase or time delay parameter that is several times of the first delay member 21, that is, the phase or time delay difference between the second delay member 23 and the first delay member 21 is several times of the phase or time delay value of the first delay member 21. Thereby, the oscillating members 11 and 13 having characteristic of phase or frequency noise reduction correlation can be coupled and noise autocorrelation can be reduced. Thus, signal noise can be reduced from several dB to several dozens of dB during system operation.

In the present embodiment, the first delay member 21 connects the output port of the oscillating member 11 to the output port of the oscillating member 13. The second delay member 23 is connected in parallel with the first delay member 21 between the output port of the oscillating member 11 and the output port of the oscillating member 13 so as to increase the time or phase delay when the two oscillating members inject signals into each other, thereby reducing noise autocorrelation. In other words, by connecting the first delay member 21 and the second delay member 23 in parallel between the two oscillating members having characteristic of phase or frequency noise reduction correlation, the phase or frequency noise reduction correlation can be enhanced, thereby obtaining a much better noise reduction effect. In addition, an optimal electrical effect can be provided to loads 31 and 33. The first delay member 21 and the second delay member 23 can be bidirectional signal lines.

Figure 3:
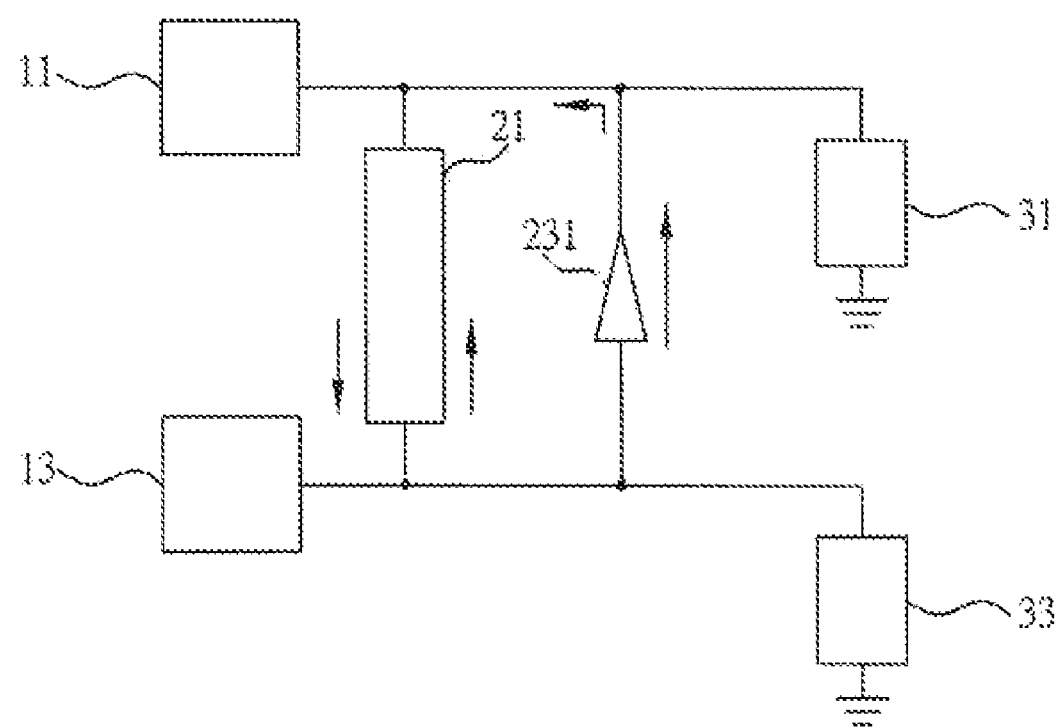
FIG. 3 is a block diagram of an oscillator coupling system according to a second embodiment of the present invention.

FIG. 3 is a block diagram of an oscillator coupling system according to a second embodiment of the present invention, wherein a unidirectional amplifier 231 functions as the second delay member 23 as seen in FIG. 2. The unidirectional amplifier 231 is used to amplify an oscillating signal outputted from the oscillating member 13. After a certain phase or time delay, the oscillating signal is further coupled to the output port of the oscillating member 11 through the unidirectional amplifier 231. Accordingly, the oscillating member 11 gets an enhanced characteristic of phase or frequency noise reduction correlation with the oscillating member 13. Meanwhile, the oscillating member 13 has a characteristic of phase or frequency noise reduction correlation with the oscillating member 11 that is only kept by the first delay member 21. Thus, the oscillating member 11 can output a better phase or frequency noise reduction signal to the load 31. Thereby, a better phase or frequency noise reduction effect can be obtained at a reduced fabricating cost.

Figure 4:
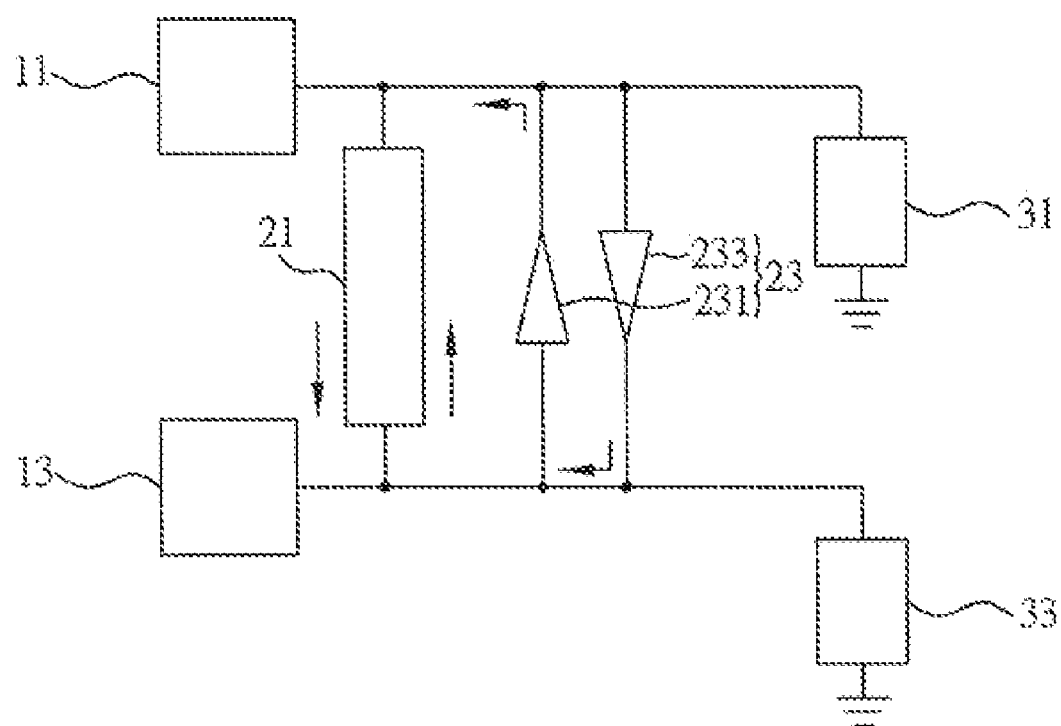
FIG. 4 is a block diagram of an oscillator coupling system according to a third embodiment of the present invention.

FIG. 4 is a block diagram of an oscillator coupling system according to a third embodiment of the present invention. In addition to the unidirectional amplifier 231 as shown in FIG. 3, another unidirectional amplifier 233 is disposed between the oscillating member 21 and the oscillating member 23 and connected in parallel with the unidirectional amplifier 231. The unidirectional amplifier 233 is used to couple a signal outputted from the oscillating member 11 to the output port of the oscillating member 13 such that the oscillating member 13 can get an enhanced characteristic of phase or frequency noise reduction correlation with the oscillating member 11, thereby reducing noise autocorrelation. That is, through the unidirectional amplifiers 231 and 233 disposed between the oscillating member 11 and the oscillating member 13, the characteristic of the noise reduction correlation of the oscillating member 11 and the oscillating member 13 can be enhanced. Thereby, a much better noise reduction effect can be obtained and signal distortion can be reduced. In addition, an optimal electrical effect can be provided to loads 31 and 33. However, signal gain, time and phase delay of the unidirectional amplifiers 231 and 233 must prevent formation of a positive feedback loop oscillation, since the positive feedback loop oscillation can destroy the needed signal frequency of the coupling system and destroy stability of the whole coupling system.

Figure 5:
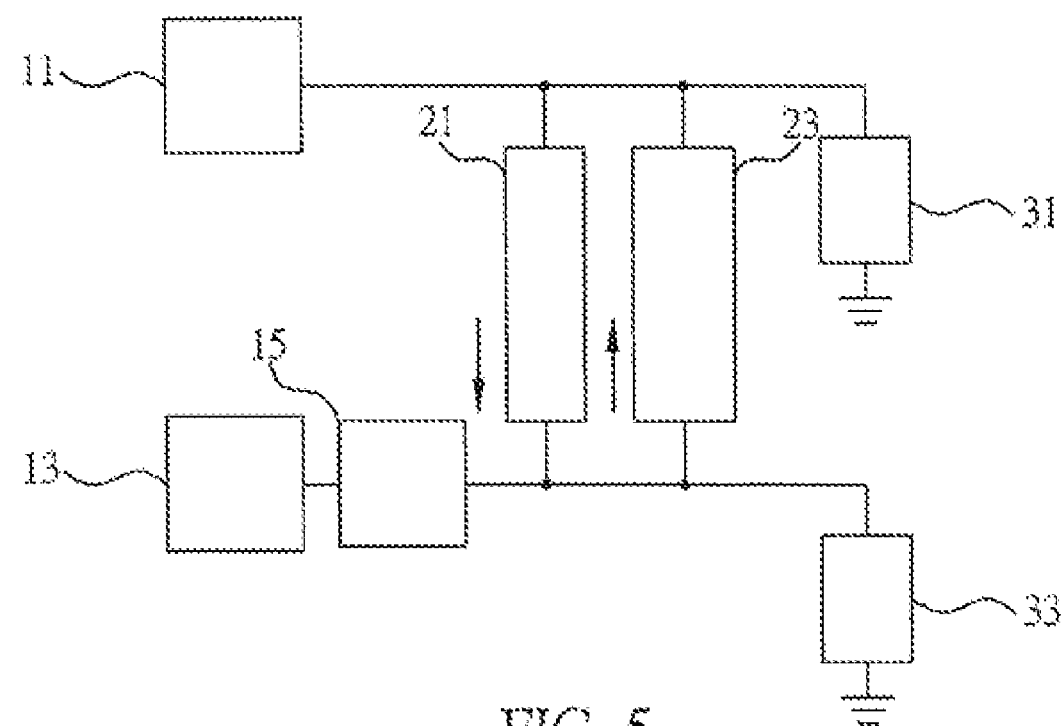
FIG. 5 is a block diagram of an oscillator coupling system according to a fourth embodiment of the present invention.

FIG. 5 is a block diagram of an oscillator coupling system that can be applied in a high frequency environment according to a fourth embodiment of the present invention. The oscillator coupling system in FIG. 5 is similar to that in FIG. 2. The oscillator coupling system of FIG. 5 mainly differs from that of FIG. 2 in that, as shown in FIG. 5, a phase shifting member 15 is disposed at the output port of the oscillating member 13 so as to suppress noise generation. A maximum noise reduction of 3 dB can be achieved in the presence of the phase shifting member 15. With the method, signals in one mode can be suppressed while signals in another mode can be enhanced, thereby improving combination of power of signals of a specific frequency. Furthermore, with the help of time or phase delay provided by the second delay member 23, at least several dB to several dozens of dB noise can be reduced by such an oscillator coupling system. Thereby, noise autocorrelation is reduced, and circuit system bandwidth and signal stability is increased. In addition, such an oscillator coupling system can reduce input/output impedance of the circuit system and save power consumption. The oscillator coupling system can be applied to a high frequency environment such as a satellite communication system, a wireless linking system and a mobile communication system.

Figure 6:
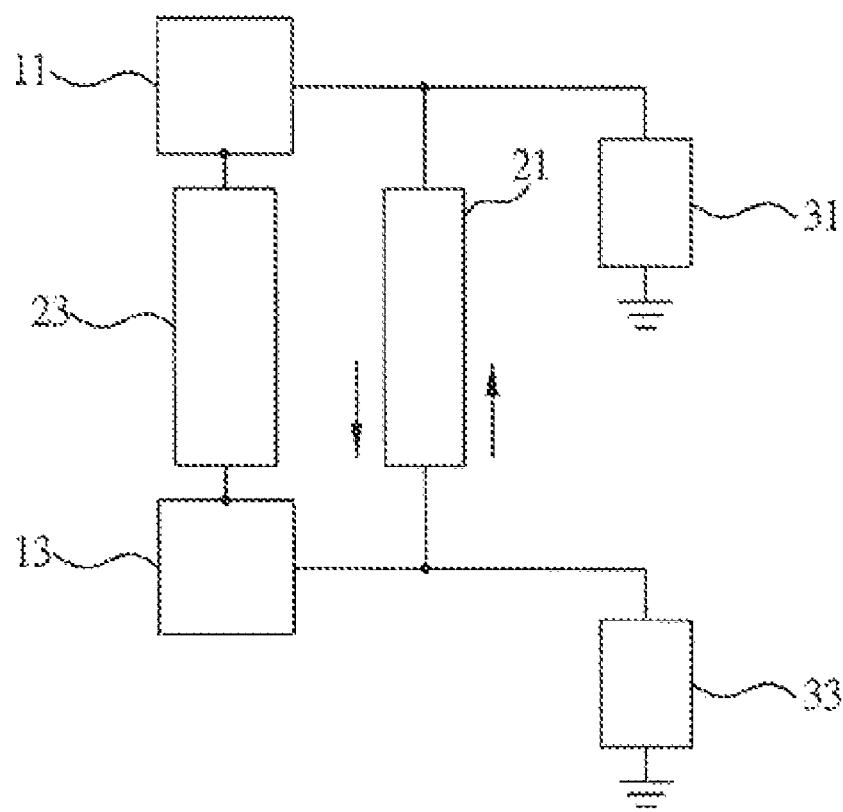
FIG. 6 is a block diagram of an oscillator coupling system according to a fifth embodiment of the present invention.

FIG. 6 is a block diagram of an oscillator coupling system according to a fifth embodiment of the present invention. The oscillator coupling system of FIG. 6 mainly differs from that of FIG. 2 in that the second delay member 23 can be coupled to any point of the oscillating members 11 and 13 such that the oscillating members can inject different signals at high and low frequency into each other through the second delay member 23. Time or phase delay of the second delay member 23 can reduce noise autocorrelation. The second delay member 23 can be at least one of an adjustable RLC circuit element, a delay signal line, a delay IC, a unidirectional amplifier and a bidirectional amplifier. Therein, the low frequency signal can be formed by the first delay member 21 which mixes signals from the coupled oscillating members.

Figure 7:
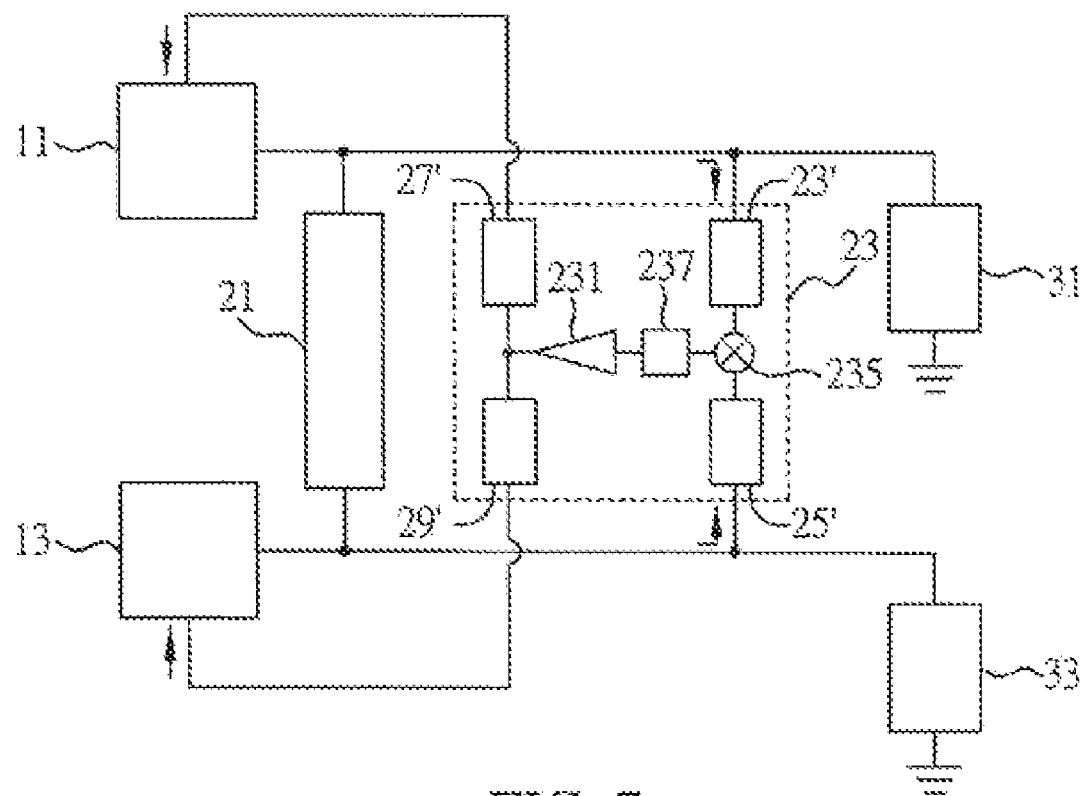
FIG. 7 is a block diagram of an oscillator coupling system according to a sixth embodiment of the present invention.

FIG. 7 is a block diagram of an oscillator coupling system according to a sixth embodiment of the present invention. The oscillator coupling system of FIG. 7 mainly differs from that of FIG. 2 in that, as shown in FIG. 7, the second delay member 23 is a compound circuit, which comprises a plurality of delay members 23', 25', 27', 29', a mixer 235, a filter 237 and an amplifier 231. Oscillating signals outputted from the oscillating members 11 and 13 respectively pass through the delay members 23' and 25' and are mixed by the mixer 235 disposed between the delay members 23' and 25'. The mixed signal is then filtered by the filter 237 connected with mixer 235 and amplified by an amplifier 231 connected with the mixer 235. Thereafter, the amplified signal is coupled to the non-output ports of the oscillating members 11 and 13 respectively through the delay members 27' and 29'. Thereby, the two oscillating members obtain enhanced characteristic of noise reduction correlation while forming oscillation and accordingly noise autocorrelation can be reduced. In brief, at least a second delay member 23 of the oscillator coupling system of the present invention mixes the signal outputted from the two oscillating members and modulates the time delay or phase delay factor of the mixed signal and outputs one of a low frequency signal and a high frequency signal and injects the signal to the non-output ports of the two oscillating members, thereby obtaining optimal phase or frequency noise reduction effect. In addition, loads 31 and 33 are provided with better electric effect. Signal distortion can also be reduced.

Figure 8:
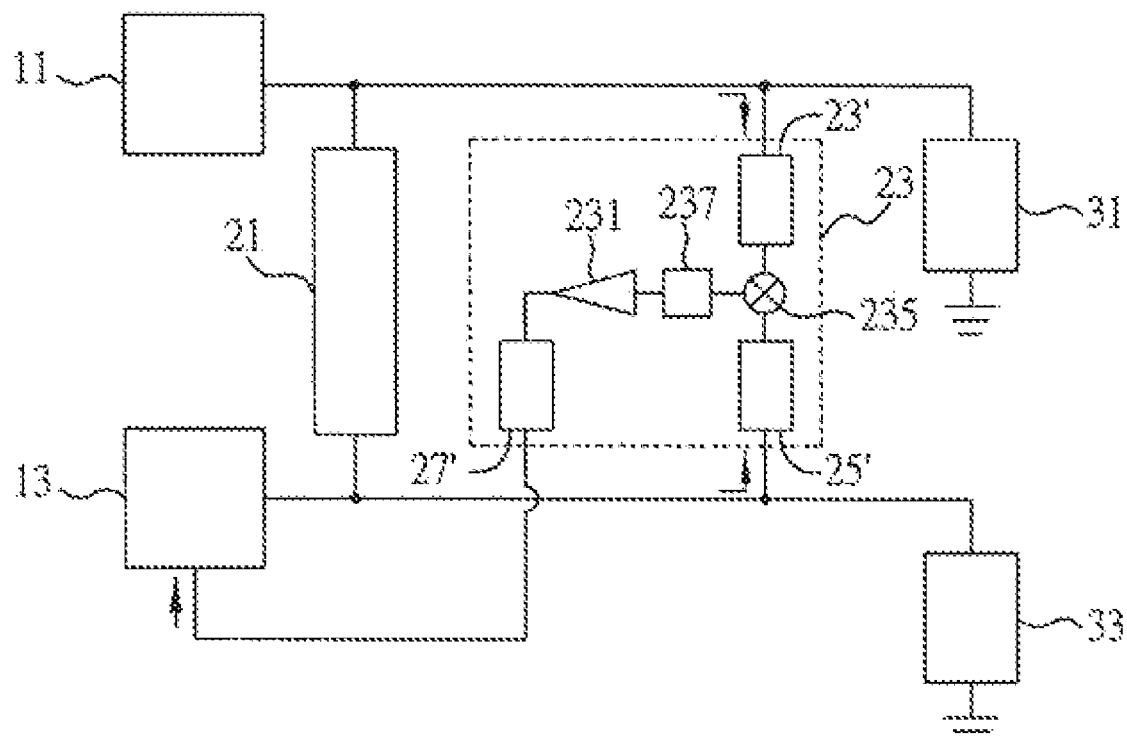
FIG. 8 is a block diagram of an oscillator coupling system according to a seventh embodiment of the present invention.

FIG. 8 is a block diagram of an oscillator coupling system according to a seventh embodiment of the present invention. The oscillator coupling system of FIG. 8 mainly differs from that of FIG. 7 in that, as shown in FIG. 8, the amplified signal from the unidirectional amplifier 231 is only coupled to the non-output port of the oscillating member 13 through a delay member 27'. Thereby, the two oscillating members can obtain noise reduction correlation characteristic while forming oscillation and accordingly noise autocorrelation can be reduced.

Figure 9:
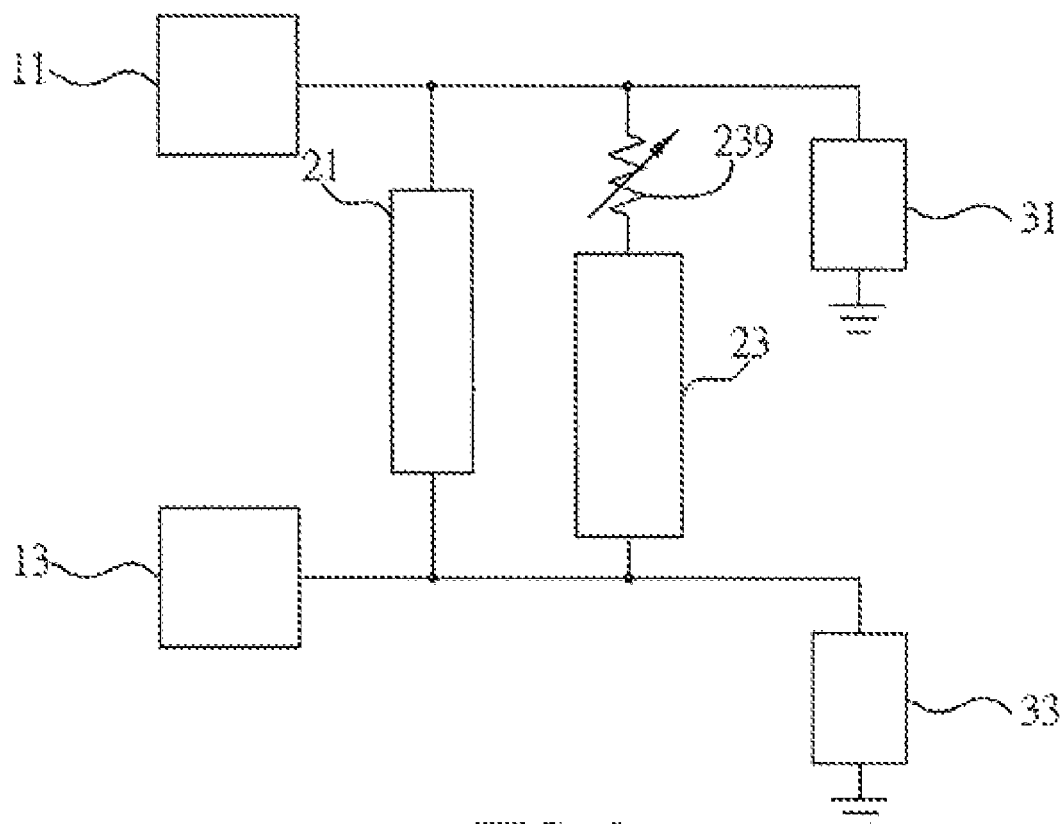
FIG. 9 is a block diagram of an oscillator coupling system according to an eighth embodiment of the present invention.

FIG. 9 is a block diagram of an oscillator coupling system according to an eighth embodiment of the present invention. The oscillator coupling system of FIG. 9 mainly differs from that of FIG. 2 in that, as shown in FIG. 9, the second delay member 23 is connected to an adjustable resistor 239 in series such that the quality factor of the second delay member 23 and strength of signals injected to the oscillating members can be adjusted. The second delay member 23 comprises at least one selected from the group consisting of an adjustable RLC circuit element, a delay signal line, a delay IC, a unidirectional amplifier, and a bidirectional amplifier. The time delay parameter or equivalent phase delay parameter of the second delay member 23 can be adjusted by combining with the resistor connected in series with the second delay member 23 so as to achieve a better phase or noise reduction correlation between the oscillating members.

Figure 10:
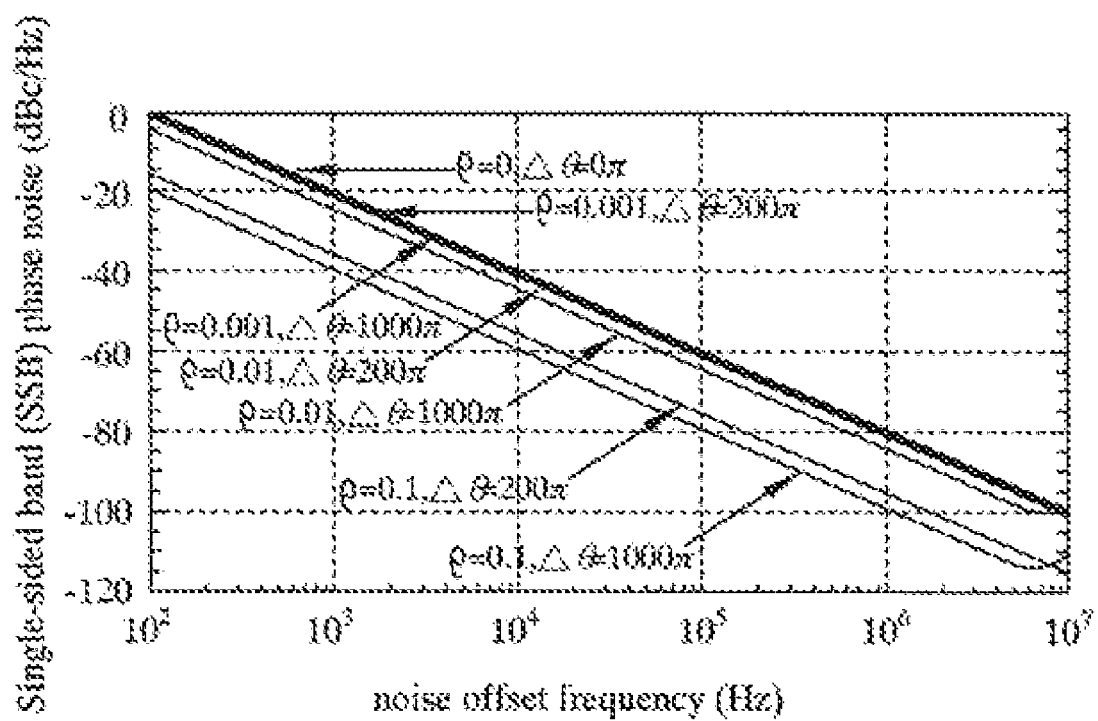
FIG. 10 is a block diagram showing system performance when adjusting strength of injection signal for changing quality factor and phase delay parameter of the oscillator coupling system.

As shown in FIG. 10, delay time is positively proportional to delay phase, thus, adjusting the delay phase is equivalent to adjusting the delay time. Also referring to FIG. 9, by connecting the resistor 239 in series with the second delay member 23, the quality factor of the second delay member 23 and the strength of the injection signal (p) can be adjusted. Meanwhile, the phase delay parameter (a) of the second delay member 23 can be adjusted, thereby obtaining a needed noise suppression effect. Therein, the smaller the resistor value, the higher the quality factor becomes, and a better noise suppression effect can be obtained. The more the phase or time delays, the better phase or frequency noise reduction effect can be obtained.

Figure 11:
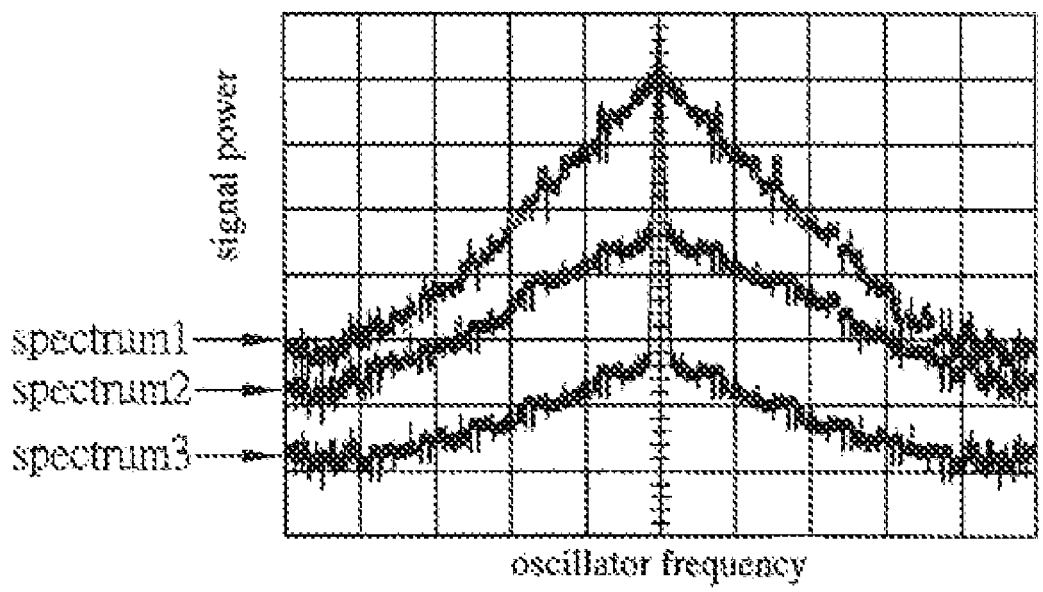
FIG. 11 is a diagram showing phase or frequency noise reduction effect of different oscillator coupling systems.

FIG. 11 is a diagram showing phase or frequency noise reduction effect of different oscillator coupling systems, wherein, spectrum 1 denotes phase or frequency noise reduction effect of a conventional oscillator coupling system, spectrum 2 denotes phase or frequency noise reduction effect of an oscillator coupling system with a phase shifting member added thereto on the condition that the signal power at the oscillating frequency is same as that in spectrum 1; and spectrum 3 denotes phase or frequency noise reduction effect of an oscillator coupling system with a second delay member added thereto. Compared with spectrum 1 and 2, spectrum 3 has a much better phase or frequency noise reduction effect. Therefore, the coupling system of the present invention can provide a better work efficiency to the circuit system and low power consumption. Meanwhile, work bandwidth and system stability can be increased.

By disposing at least a first delay member and at least a second delay member between the at least two oscillating members, the two oscillating members are coupled and a better phase or frequency noise reduction effect can be achieved. Further, through a series connection between the resistor and the second delay member, the quality factor of the second delay member and strength of the injection signal can be adjusted. By changing the capacitance of the second delay member, the time delay parameter and equivalent phase delay parameter of the second delay member can be adjusted. Therefore, through simple circuit element configuration, the oscillator coupling system of the present invention reduces noise autocorrelation, decreases signal distortion and increases system stability. Furthermore, the oscillator coupling system of the present invention is suitable to be applied in a high frequency environment so as to achieve wide bandwidth and low noise interference, change input/output impedance and save power consumption.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An oscillator coupling system, comprising:
   a plurality of oscillating members;
   at least a first delay member connecting at least two of the oscillating members; and
   at least a second delay member for connection with the two oscillating members and introducing a phase or time delay parameter at least several times larger than that of the first delay member so as to be coupled to the two oscillating members having correlated phase or frequency noise suppression and reduce noise autocorrelation of the oscillator coupling system, thereby reducing noise by at least several dB to several dozens dB during system operation, wherein the second delay member is connected in series to a resistor so as to adjust a quality factor of the second delay member and strength of signals injected.

2. The oscillator coupling system of claim 1, wherein the first delay member is one of a signal line and an amplifier.

3. The oscillator coupling system of claim 2, wherein the signal line is one selected from the group consisting of a cable, a flat cable, a conductive line, and an electric transmission line.

4. The oscillator coupling system of claim 2, wherein the amplifier comprises at least one of a unidirectional amplifier and a bidirectional amplifier.

5. The oscillator coupling system of claim 1, wherein the second delay member is one of a phase delay member and a time delay member.

6. The oscillator coupling system of claim 5, wherein the phase delay member comprises one selected from the group consisting of an adjustable RLC circuit element, a delay signal line, a delay IC, and an amplifier.

7. The oscillator coupling system of claim 5, wherein the time delay member comprises one selected from the group consisting of a signal line, an adjustable RLC circuit element, a delay signal line, a delay IC, and an amplifier.

8. The oscillator coupling system of claim 7, wherein the signal line comprises one selected from the group consisting of a cable, a flat cable, a conductive line, and an electric transmission line.

9. The oscillator coupling system of claim 6, wherein the amplifier comprises at least one of a unidirectional amplifier and a bidirectional amplifier.

10. The oscillator coupling system of claim 7, wherein the amplifier comprises at least one of a unidirectional amplifier and a bidirectional amplifier.

11. The oscillator coupling system of claim 1, wherein the second delay member comprises a capacitor for adjusting the phase or time delay parameter of the second delay member.

12. The oscillator coupling system of claim 11, wherein the capacitor is an adjustable capacitor.

13. An oscillator coupling system, comprising:
    a plurality of oscillating members;
    at least a first delay member connecting at least two of the oscillating members; and
    at least a second delay member for connection with the two oscillating members and introducing a phase or time delay parameter at least several times larger than that of the first delay member so as to be coupled to the two oscillating members having correlated phase or frequency noise suppression and reduce noise autocorrelation of the oscillator coupling system, thereby reducing noise by at least several dB to several dozens dB during system operation, wherein the second delay member comprises a capacitor for adjusting the phase or time delay parameter of the second delay member.

14. The oscillator coupling system of claim 13, wherein the capacitor is an adjustable capacitor.

15. The oscillator coupling system of claim 13, wherein the second delay member is connected in series to a resistor so as to adjust a quality factor of the second delay member and strength of signals injected.

* * * * *